United States Patent
Hussain et al.

(10) Patent No.: US 6,960,092 B1
(45) Date of Patent: Nov. 1, 2005

(54) COMPRESSION MOUNT AND ZERO INSERTION FORCE SOCKET FOR IC DEVICES

(75) Inventors: Rafiq Hussain, Fremont, CA (US); Jeffrey Cymerys, Corona Del Mar, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/627,516

(22) Filed: Jul. 25, 2003

(51) Int. Cl.[7] .......................................... H01R 13/15
(52) U.S. Cl. .................................... 439/263; 439/70
(58) Field of Search ........................ 439/263, 264, 439/260, 259, 83, 66, 70

(56) References Cited

U.S. PATENT DOCUMENTS

| | | | | |
|---|---|---|---|---|
| 4,082,399 A | * | 4/1978 | Barkhuff | 439/264 |
| 4,644,269 A | * | 2/1987 | Golder et al. | 324/755 |
| 4,684,193 A | * | 8/1987 | Havel | 439/259 |
| 4,815,987 A | * | 3/1989 | Kawano et al. | 439/263 |
| 4,887,974 A | * | 12/1989 | Ichimura et al. | 439/259 |
| 5,123,855 A | * | 6/1992 | Petersen | 439/263 |
| 5,766,021 A | * | 6/1998 | Pickles et al. | 439/70 |
| 6,242,933 B1 | | 6/2001 | Yap | 324/755 |
| 6,280,202 B1 | * | 8/2001 | Alden et al. | 439/66 |
| 6,558,182 B1 | * | 5/2003 | Ohkita et al. | 439/342 |
| 6,746,252 B1 | * | 6/2004 | Scott | 439/70 |

* cited by examiner

*Primary Examiner*—Gary Paumen
*Assistant Examiner*—Phuongchi Nguyen
(74) *Attorney, Agent, or Firm*—Monica H. Choi

(57) ABSTRACT

In a socket system and method for coupling a pin of an IC (integrated circuit) device to a contact pad of a circuit board, a zif opening on a socket asserts substantially zero force as the pin of the IC device is inserted therein. In addition, a compression mount lead on the socket presses against the contact pad of the circuit board. Once inside the zif opening, the pin is coupled to the compression mount lead via forking leads that press against the pin. Thus, substantially zero force is applied on the body of the IC device. Furthermore, top portions of the forking leads contact a top portion of the pin toward the IC device to minimize an electrical path length.

25 Claims, 5 Drawing Sheets

COMPRESSION MOUNT AND ZERO INSERTION FORCE SOCKET FOR IC DEVICES

TECHNICAL FIELD

The present invention relates generally to integrated circuit technology, and more particularly, to a socket system and method using zero insertion force and compression mount for holding an IC (integrated circuit) device to a circuit board.

BACKGROUND OF THE INVENTION

Referring to FIG. 1, a socket system 100 of the prior art includes a socket 102 for coupling a plurality of pins 104 of an IC (integrated circuit) device 106 to a corresponding plurality of contact pads 108 of a circuit board 110. The pins 104 of the IC device may be arranged as an array when the IC device is implemented as a micro-pin grid array IC package, as known to one of ordinary skill in the art of integrated circuits. Each of the pins 104 of the IC device 106 is coupled to a respective one of the contact pads 108 via a respective one of the leads 112 of the socket 102. For example, a first pin 114 of the IC device 106 is coupled via a first lead 116 of the socket 102 to a first contact pad 118 of the circuit board 110, which may be a PCB (printed circuit board).

Electrical signals are routed to or from the pins 114 of the IC device 106 via the contact pads 108 of the circuit board 110 during testing or operation of the IC device 106, as known to one of ordinary skill in the art of integrated circuits. Referring to FIGS. 1 and 2, the socket 102 is mounted to the circuit board 110 with a screw mechanism 120 such that each of the leads 112 of the socket 102 makes electrical contact with a respective one of the contact pads 108 of the circuit board 110.

In addition, the IC device 106 is mounted to the socket 102 with a clamping mechanism 122 such that each of the pins 104 of the IC device 106 makes electrical contact with a respective one of the leads 112 of the socket 102. Each of the pins 104 of the IC device 106 is inserted into a respective opening within the socket 102 to make electrical contact with a corresponding one of the leads 112 of the socket 102. The clamping mechanism 122 clamps down the body of the IC device 106 (i.e., the portion of the IC device not including the pins 104) onto the socket 102.

FIG. 3 shows a cross sectional view of an example opening 124 for the first pin 114 of the IC device 106 making contact with the first contact pad 118 of the circuit board 110 via the first lead 116 of the socket 102. The lead 116 is within the opening 124 of the socket 102. In the prior art, the lead 116 is part of a two-ended pogo spring mechanism including a first pogo spring 126 disposed toward the pin 114 and a second pogo spring 128 disposed toward the contact pad 118.

Referring to FIGS. 2 and 4, when the socket 102 is mounted to the circuit board 110 and the body of the IC device 106 is clamped to the socket 102, the pin 114 is inserted into the opening 124 and makes electrical contact with the top end of the lead 116. In addition, the bottom end of the lead 116 makes electrical contact with the contact pad 118. The first pogo spring 126 is compressed and pushes the top end of the lead 116 against the bottom of the pin 114 to ensure that the top end of the lead 116 makes electrical contact with the bottom of the pin 114. Similarly, the second pogo spring 128 is compressed and pushes the bottom end of the lead 116 against the contact pad 118 to ensure that the bottom end of the lead 116 makes electric contact with the contact pad 118.

Referring to FIGS. 2 and 4, one disadvantage of the prior art socket system 100 is that the body of the IC device 106 is clamped to the socket 102. Because of the compression force on each of the pins 104 from the top end of the respective lead 116 within the socket 102, the IC device 106 is clamped to the socket 102. Such clamping force and the compression force on the pins 104 may be deleterious to the IC device 106. With advancement of integrated circuit technology, the IC device has an increased number of pins 104. A larger number of pins results in increased total compression force on the pins 104 and increased clamping force on the IC device 106. Such forces may warp and damage the structures of the IC device 106 which may lead to malfunction of the IC device 106.

In addition, in the prior art socket system 100, the top of the lead 116 makes electrical contact with the bottom of the pin 114. As a result, the electrical path length between the IC device 106 and the contact pad 118 is not minimized in the prior art socket system 100. However, a minimized electrical path length between the IC device 106 and the contact pad 118 is desired for minimizing resistance which enhances the speed performance of the IC device 106.

Thus, a socket system is desired that minimizes force on the IC device 106 and that minimizes the electrical path length between the IC device 106 and the contact pad 118.

SUMMARY OF THE INVENTION

Accordingly, in a general aspect of the present invention, zif (zero-insertion-force) openings are used in a socket system for minimizing force to the IC device. In addition, forking leads are used to make electrical contact with a top portion of the pin of the IC device for minimizing the electrical path length.

In one embodiment of the present invention, a socket system and method couples a pin of an IC (integrated circuit) device to a contact pad of a circuit board. A zif opening on a socket asserts substantially zero force as the pin of the IC device is inserted therein, and a compression mount lead on the socket presses against the contact pad of the circuit board.

In a further embodiment of the present invention, forking leads are coupled to the compression mount lead and surround the pin within the zif opening. An actuation plate and an actuation lever press the forking leads against the pin such that the pin is coupled to the compression mount lead via the forking leads.

In another embodiment of the present invention, top portions of the forking leads contact a top portion of the pin toward the IC device to minimize an electrical path length between the IC device and the circuit board.

In yet another embodiment of the present invention, the compression mount lead is comprised of one of a pogo spring or a J-bend lead.

In a further embodiment of the present invention, a back plate is mounted to a back-side of the circuit board when the socket is mounted to a front-side of the circuit board, for preventing warping of the circuit board.

In this manner, with use of the zif opening, substantially zero force is applied on the body of the IC device that is not clamped to the socket in an embodiment of the present invention. Rather, the pin of the IC device is compressed between the forking leads within the zif opening to be coupled to the contact pad of the circuit board. In addition, the forking leads make electrical contact with the top portion of the pin toward the IC device to minimize the electrical path length between the IC device and the contact pad of the circuit board.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

Figure 5:
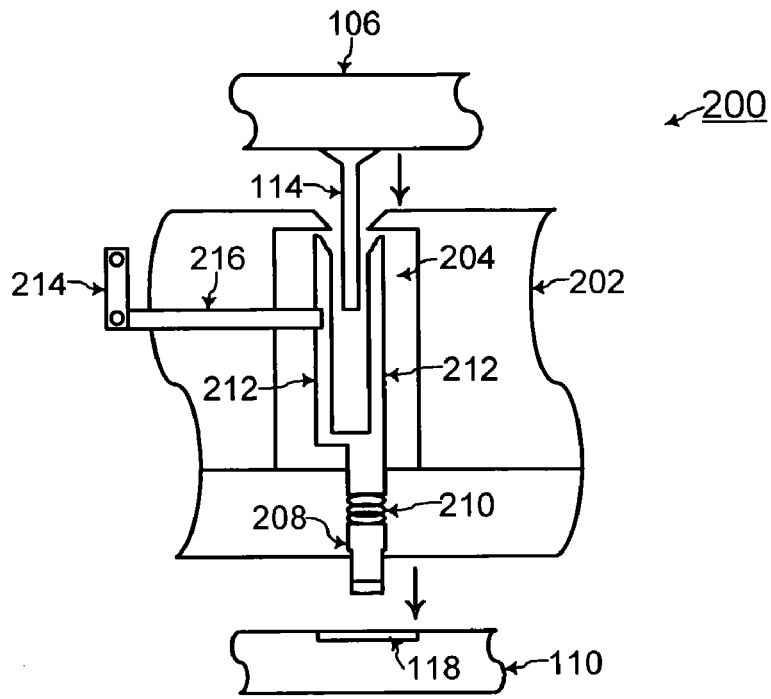
FIG. 5 shows a cross-sectional view of a compression mount lead within a zif (zero-insertion-force) opening of a socket according to an embodiment of the present invention.
Figure 8:
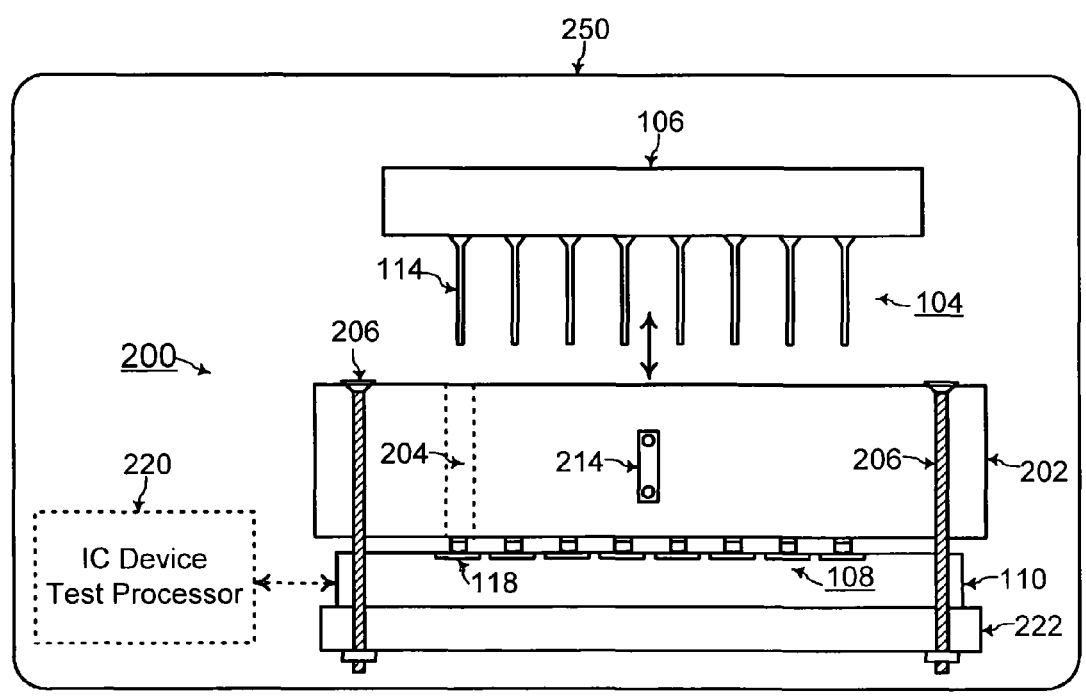
FIG. 8 shows components of the socket system having the socket of FIG. 5 and including a back plate, according to an embodiment of the present invention.

Referring to FIGS. 5 and 8, a socket system 200 includes a socket 202 for coupling the pins 104 of the IC device 106 to the contact pads 108 of the circuit board 110, according to an embodiment of the present invention. The mechanism within one zif (zero-insertion-force) opening 204 of the socket 202 is illustrated in FIG. 5 for simplicity and clarity of illustration and description. However, the socket 202 includes a plurality of such zif openings with each zif opening coupling a respective one of the pins 104 of the IC device 106 to a respective one of the contact pads 108. FIG. 5 illustrates one example zif opening 204 for coupling an example pin 114 of the IC device 106 to an example contact pad 118 of the circuit board 110.

Figure 6:
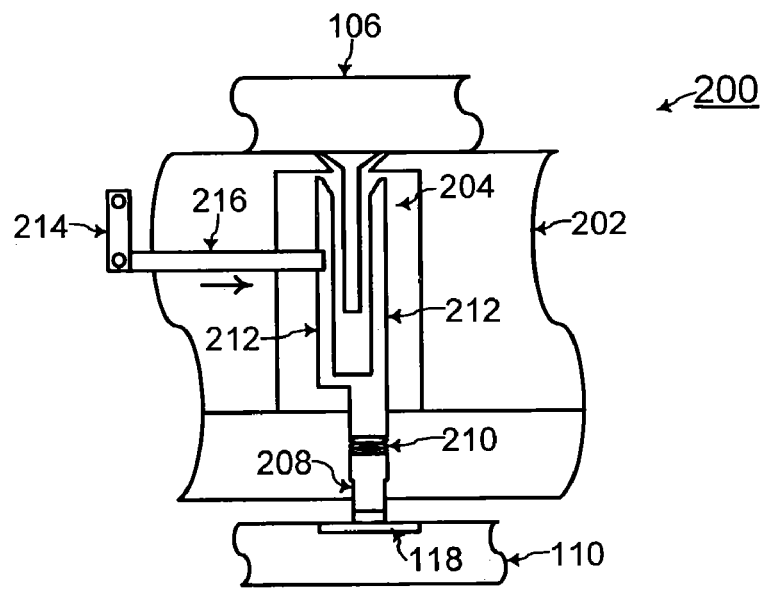
FIG. 6 shows the socket of FIG. 5 mounted to the circuit board and having the pin of the IC device inserted into the zif opening, according to an embodiment of the present invention.

Referring to FIGS. 6 and 8, the socket 202 is mounted to the circuit board 110 with a screw mechanism 206 according to one embodiment of the present invention. Screw mechanisms are known to one of ordinary one of skill in the art of mechanics, and the present invention may be implemented with any other known mechanisms for mounting the socket 202 to the circuit board 110. When the socket 202 is mounted to the circuit board 110, a plurality of leads, such as an example lead 208, make electrical contact with the contact pads 108 of the circuit board 110.

Further referring to FIGS. 6 and 8, when the socket 202 is mounted to the circuit board 110, a pogo spring 210 on the lead 208 is compressed to push the bottom end of the lead 208 toward the contact pad 118. Such compression force of the pogo spring 210 ensures that the bottom end of the lead 208 makes electrical contact with the contact pad 118 of the circuit board 110.

In addition, after the socket 202 is mounted to the circuit board 110, the IC device 106 is lowered, and the pins 104 of the IC device 106 are inserted into the zif openings of the socket 202. In FIG. 6, the pin 114 of the IC device 106 is inserted into the zif opening 204 of the socket 202. According to an aspect of the present invention, as the pin 114 is inserted into the zif opening 204, substantially zero force is initially applied on the pin 114 from the zif opening 204.

Figure 7:
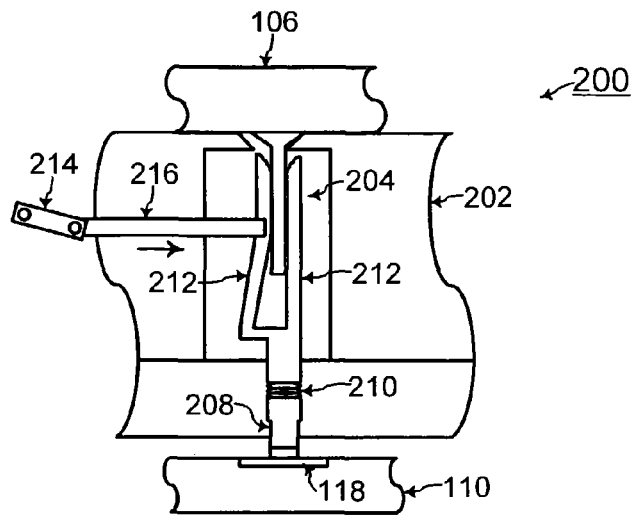
FIG. 7 shows the socket of FIG. 6 with forking leads within the zif opening making electrical contact with a top portion of the pin of the IC package, according to an embodiment of the present invention.

Forking leads 212 are situated within the zif opening 204 to surround the pin 114 that is inserted therein. An actuation lever 214 and an actuation plate 216 are coupled to one of the forking leads 212. Referring to FIGS. 6 and 7, after the pin 114 is inserted between the forking leads 212 within the zif opening 204, the actuation lever 214 is pulled to push the actuation plate against one of the forking leads 212 to bend the forking leads. In this manner, the actuation plate 216 pushes the forking leads 212 to press against and make electrical contact with the pin 114 within the zif opening 204. Thus, the pin is electrically coupled to the contact pad 118 via the forking leads 212 and the compression mount lead 208.

Figure 1:
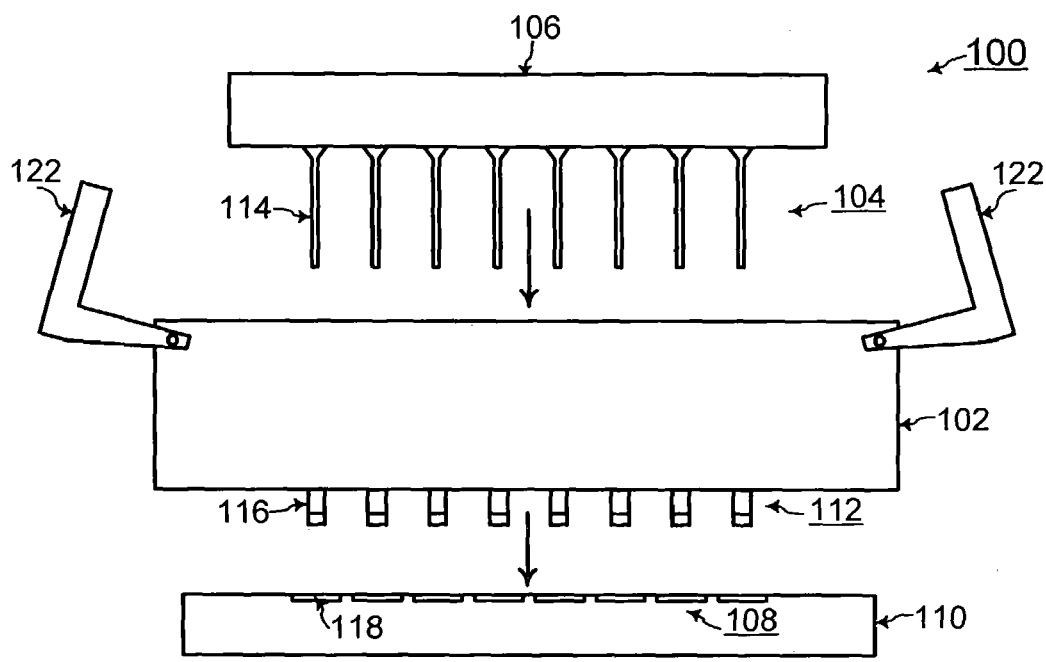
FIG. 1 shows components of a socket system for coupling pins of an IC device to contact pads of a circuit board, according to the prior art.
Figure 2:
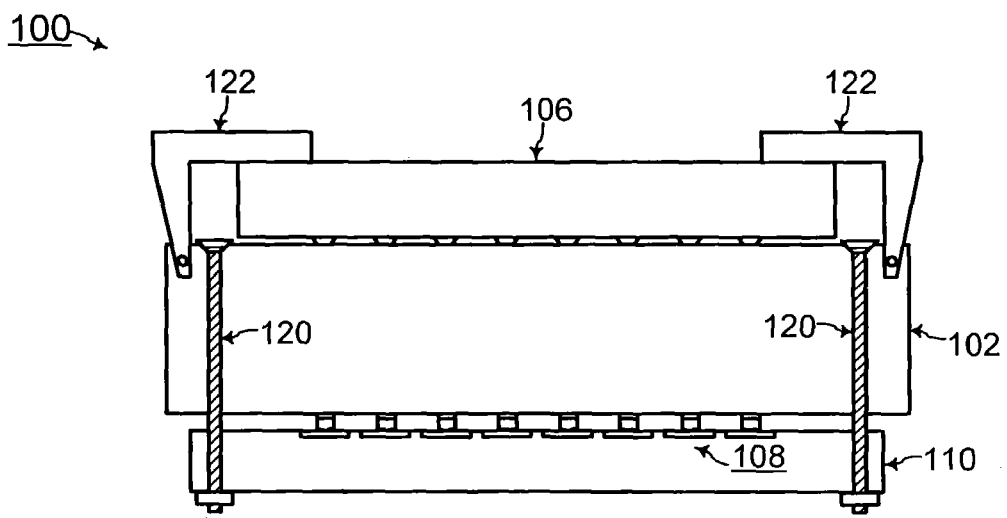
FIG. 2 shows the components of the socket system of FIG. 1 when the socket is mounted to the circuit board and when the IC device is clamped to the socket, according to the prior art.
Figure 3:
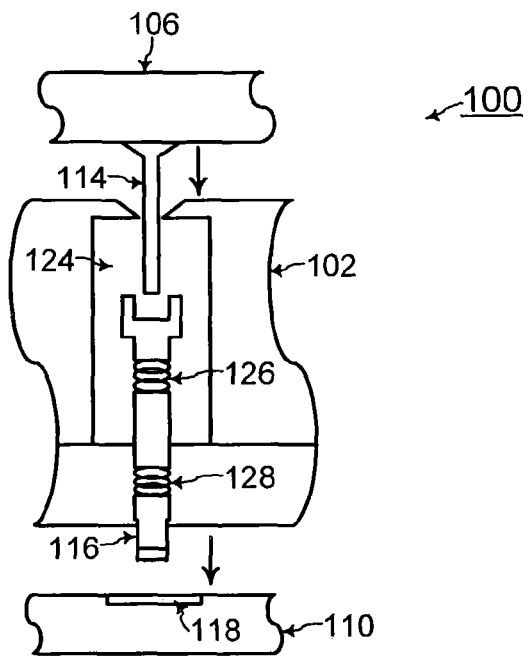
FIG. 3 shows a cross-sectional view of a lead within an opening of the socket of FIGS. 1 and 2 with dual ended pogo springs, according to the prior art.
Figure 4:
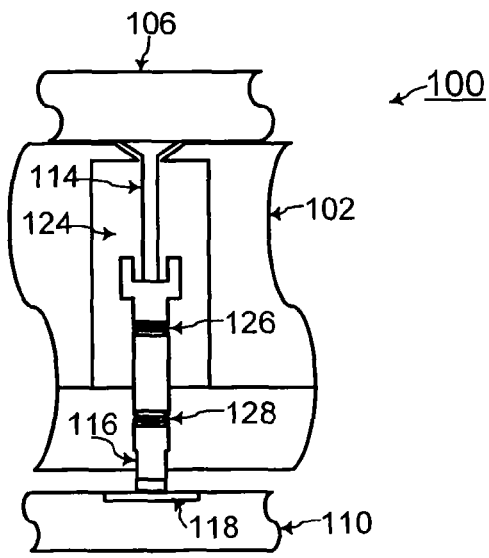
FIG. 4 shows the dual ended pogo springs of FIG. 3 compressed for coupling the pin of the IC device to the contact pad of the circuit board, according to the prior art.

In addition, the actuation plate 216 is situated such that the forking leads 212 contact a top half of the pin 114 toward the IC device 106. Thus, the electrical path length between the IC device 106 and the contact pad 118 is minimized in an embodiment of the present invention. In the prior art of FIG. 4, the bottom surface of the pin 114 furthest from the IC device 106 makes electrical contact with the lead 116. In contrast, in FIG. 7 of the present invention, the forking leads 212 make electrical contact with the pin 114 as near the body of IC device 106 as possible, thus minimizing the electrical path length between the IC device 106 and the contact pad 118.

Such minimized electrical path length is advantageous for minimizing resistance and hence maximizing the speed performance of the IC device 106. With such enhanced speed performance, the socket system 200 of the present invention may advantageously be used in an IC device testing system 250 in FIG. 8 for high frequency testing of the IC device 106. In that case, an IC device test processor 220 tests for operation of the IC device 106 with high frequency signals (such as signals with frequencies in the giga-hertz range) applied or generated on the contact pads 108.

Further, with a plurality of the zif opening 204 on the socket 202, substantially zero force is asserted on the pins 104 as the pins 104 are inserted into such zif openings on the socket 202. The forking leads 212 within the zif opening 204 assert force substantially just on the pins 104 for coupling the pins to the contact pads 108 on the circuit board 110. Thus, the body of the IC device 106 is not clamped to the socket 202, and substantially zero force is applied on the body of the IC device 106 to preserve the integrity if the IC device 106.

Further referring to FIG. 8, in a further embodiment of the present invention, a back plate 222 is mounted to the back side of the circuit board 110 when the socket 202 is mounted to the front side of the circuit board 110. The front side of the circuit board 110 has the contact pads 108 printed thereon, and the socket 202 is mounted to the front side for providing electrical connection to such contact pads 108.

Referring to FIG. 7, the lead 208 on the socket 202 pushes down against the contact pad 118 due to the force from the compressed pogo spring 210. With advancement of integrated circuit technology, the number of such leads from the socket is increasing to increase the total compression force on the circuit board 110. A large total compression force from all of such leads from the socket pushing down on the circuit board 110 may warp and damage the circuit board 110. Mounting a back plate 222 to the back side of the circuit board 110 prevents such warping to prevent damage to the circuit board 110 from such compression force.

Figure 9:
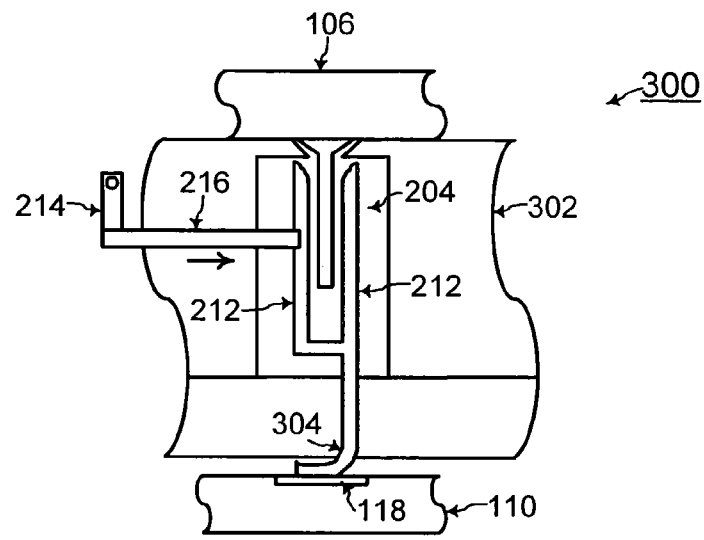
FIG. 9 shows a cross-sectional view of a compression mount lead comprised of a J-bend lead within the zif opening of the socket, according to another embodiment of the present invention.
Figure 10:
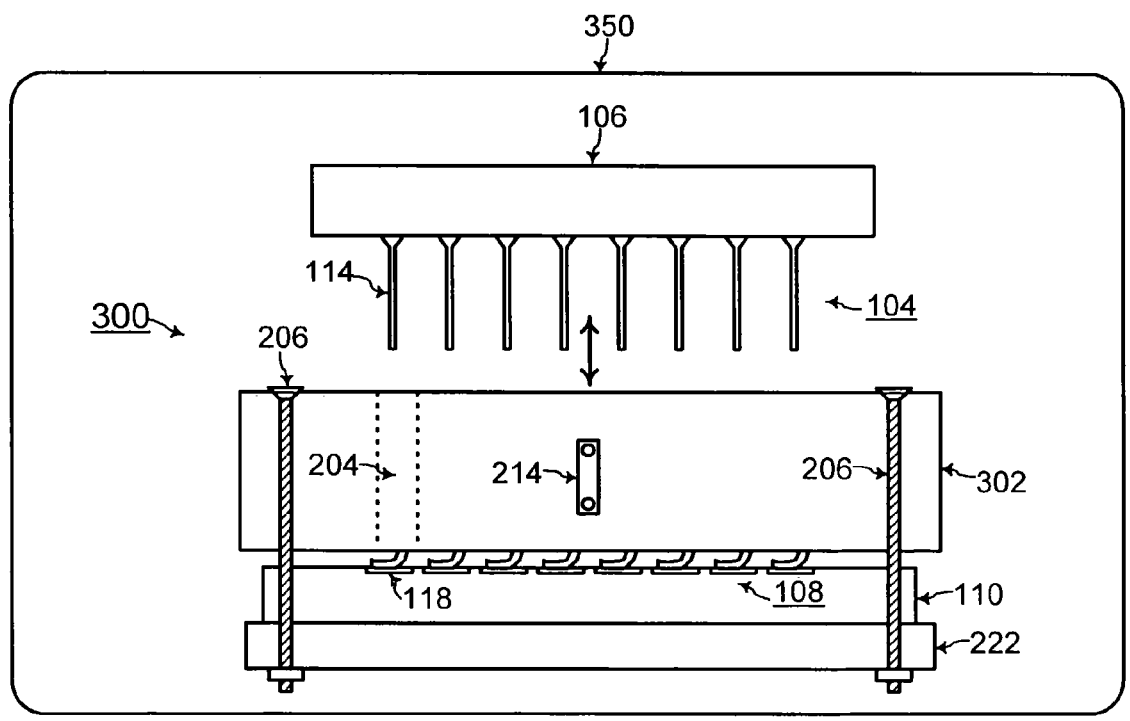
FIG. 10 shows components of the socket system having the socket of FIG. 9, according to an embodiment of the present invention.

FIG. 9 shows another embodiment of a socket system 300 with an alternative socket 302. The socket 302 of FIG. 9 is similar to the socket 202 of FIGS. 5, 6, and 7, with similarly numbered elements having similar structure and function. However, the socket 302 of FIG. 9 has a J-bend lead 304 for the bottom compression mount lead instead of the pogo spring mechanism 210 of the socket 202. Referring to FIGS. 9 and 10, when the socket 302 is mounted to the circuit board 110, the J-bend compression mount lead 304 is pressed down onto the contact pad 118 to make electrical contact with the contact pad 118. The J-bend lead 304 advantageously is a simple alternative mechanism for the compression mount lead that contacts the contact pad of the circuit board 110.

In either case of the pogo spring mechanism 210 of FIG. 6 or the J-bend lead 304 of FIG. 9, such compression mount leads contact the contact pads of the circuit board 110 when the socket 202 or 302 is mounted to the circuit board 110. With such compression mount leads, if the socket 202 or 302 were to become defective, the defective socket is taken off the circuit board and is simply replaced with another non-defective socket. Thus, the circuit board may still be reused despite a defective socket. For example, in a testing system, the socket 202 or 302 may become defective after tens of thousands of IC devices are tested thereon. Then, such a defective socket is taken off the circuit board 110, and a non-defective socket is mounted to the circuit board 110.

Some zif openings may be found in OEM (original equipment manufacturer) systems where the lead within the zif opening is permanently soldered to the circuit board 110. However, such permanent soldering in the prior art is disadvantageous because the whole circuit board is discarded when any mechanism within the zif opening becomes defective.

When the socket system 200 or 300 is used within a test system, millions of IC devices are tested with such a socket system. Thus, the socket system is likely to become defective with time. With compression mount leads for the socket, the defective socket is taken off the circuit board and is simply replaced with another non-defective socket such that the circuit board may be reused.

In an alternative embodiment of the present invention, referring to FIG. 10, the socket system 200 or 300 is part of an OEM (original equipment maker) machine 350 such as a PC (personal computer). For example, the circuit board 110 may be the mother-board of a PC. The socket system 200 or 300 using the socket 202 or 302 with the zif openings and compression mount leads may be advantageous for lowered tariff costs when components of an OEM machine are assembled domestically.

Typically, the tariff rate imposed on an imported OEM machine is higher when the OEM machine is pre-assembled before being imported than if the components of the OEM machine were imported and then assembled domestically. In the prior art, the leads of the socket within the OEM machine are soldered to the circuit board. Because soldering is labor-intensive, the socket is soldered to the circuit board over-seas before the OEM machine is imported resulting in higher tariff costs.

In contrast, use of the compression mount leads in the socket 202 or 302 of embodiments of the present invention is a simpler and less labor intensive mechanism for mounting the socket to the circuit board. Thus, the IC package 106, the socket 202 or 302, and/or the circuit board 110 may be imported as component parts and then assembled into the OEM machine domestically, for the lowered tariff rate.

The foregoing is by way of example only and is not intended to be limiting. For example, the present invention is described in reference to example implementations of the zif opening and the compression mount lead. The present invention may be practiced with different mechanisms of the zif opening and the compression mount lead. Furthermore, various implementations for the components 206, 210, 212, 214, 216, and 304 of FIGS. 5 and 9, individually, are known to one of ordinary skill in the art of mechanics. In addition, the socket system 200 or 300 of the present invention is mentioned for use within a high frequency test system 250 or within an OEM machine 350. However, the socket system 200 or 300 may be used for any other applications using a socket for coupling pins of an IC device to contact pads of a circuit board. The present invention is limited only as defined in the following claims and equivalents thereof.

We claim:

1. A socket system for coupling a pin of an IC (integrated circuit) device to a contact pad of a circuit board, comprising:
   a zif (zero-insertion-force) opening on a socket that asserts substantially zero force when a whole of the pin of the IC device is completely inserted within the zif opening;
   a compression mount lead disposed on the socket, wherein the compression mount lead includes a compression mechanism that compresses the compression mount lead against the contact pad of the circuit board with a compressive force; and
   a mechanism for coupling the pin to the compression mount lead.

2. A socket system for coupling a pin of an IC (integrated circuit) device to a contact pad of a circuit board, comprising:
   a zif (zero-insertion-force) opening on a socket that asserts substantially zero force as the pin of the IC device is completely inserted therein;
   a compression mount lead disposed on the socket, wherein the compression mount lead includes a compression mechanism that compresses the compression mount lead against the contact pad of the circuit board with a compressive force; and
   a mechanism for coupling the pin to the compression mount lead;
   wherein the socket is mounted onto the circuit board such that the compression mount lead is compressed against the contact pad.

3. The socket system of claim 1, wherein substantially zero force is asserted on the body of the IC device when the pin is coupled to the contact pad.

4. The socket system of claim 1, further comprising:
a back plate mounted to a back-side of the circuit board when the socket is mounted to a front-side of the circuit board.

5. The socket system of claim 1, wherein the socket and the circuit board are part of a test system for testing the IC device.

6. The socket system of claim 1, wherein the socket and the circuit board are parts for an OEM (original equipment manufacturer) machine.

7. The socket system of claim 1, wherein the compression mount mechanism is comprised of a pogo spring.

8. The socket of claim 1, wherein the compression mount lead is comprised of a J-bend lead that is compressed against the contact pad of the circuit board.

9. The socket system of claim 1, wherein the mechanism for coupling the pin to the compression mount lead applies a force on the pin in a direction that is always perpendicular to a length of the pin.

10. The socket system of claim 9, wherein the mechanism for coupling the pin to the compression mount lead comprises:
forking leads coupled to the compression mount lead and surrounding the pin within the zif opening; and
an actuation plate and an actuation lever that press the forking leads against the pin with the actuation plate being pressed toward the forking leads in only one lateral direction that is perpendicular to the length of the pin such that the pin is coupled to the compression mount lead via the forking leads.

11. The socket system of claim 10, wherein top portions of the forking leads contact a top portion of the pin toward the IC device to minimize an electrical path length between the IC device and the circuit board.

12. A socket system for coupling a pin of an IC (integrated circuit) device to a contact pad of a circuit board, comprising:
means for asserting substantially zero force on the pin of the IC device as a whole of the pin is completely inserted into a zif (zero-insertion-force) opening on a socket;
means for compressing a compression mount lead against the contact pad of the circuit board with a compressive force; and
means for coupling the pin of the IC device within the zif opening to the compression mount lead;
wherein the socket is mounted onto the circuit board such that the compression mount lead is compressed against the contact pad.

13. The socket system of claim 12, further comprising:
means for minimizing an electrical path length between the IC device and the circuit board.

14. The socket system of claim 12, further comprising:
means for asserting substantially zero force on the body of the IC device when the pin is coupled to the compression mount lead with a force applied on the pin in a direction only perpendicular to a length of the pin.

15. A method for coupling a pin of an IC (integrated circuit) device to a contact pad of a circuit board, including the steps of:
asserting substantially zero force on the pin when a whole of the pin of the IC device is completely inserted within a zif (zero-insertion-force) opening on a socket;
compressing a compression mount lead on the socket with a compressive force against the contact pad of the circuit board; and
coupling the pin to the compression mount lead.

16. A method for coupling a pin of an IC (integrated circuit) device to a contact pad of a circuit board, including the steps of:
asserting substantially zero force on the pin as a whole of the pin of the IC device is completely inserted into a zif (zero-insertion-force) opening on a socket;
compressing a compression mount lead on the socket with a compressive force against the contact pad of the circuit board;
coupling the pin to the compression mount lead; and
mounting the socket onto the circuit board such that the compression mount lead is compressed against the contact pad.

17. The method of claim 15, further including the step of:
asserting substantially zero force on the body of the IC device when the pin is coupled to the contact pad.

18. The method of claim 15, further including the step of:
mounting a back plate to a back-side of the circuit board when the socket is mounted to a front-side of the circuit board.

19. The method of claim 15, wherein the socket and the circuit board are part of a test system for testing the IC device.

20. The method of claim 15, wherein the socket and the circuit board are parts for an OEM (original equipment manufacturer) machine.

21. The method of claim 15, wherein the compression mount lead is comprised of a pogo spring.

22. The method of claim 15, wherein the compression mount lead is comprised of a J-bend lead that is compressed against the contact pad of the circuit board.

23. The method of claim 15, further comprising:
coupling the pin to the compression mount lead with a force on the pin in a direction that is always perpendicular to a length of the pin.

24. The method of claim 23, further including the step of:
pressing forking leads against the pin with an actuation plate that is pressed toward the forking leads in only one lateral direction that is perpendicular to the length of the pin such that the pin is coupled to the compression mount lead via the forking leads.

25. The method of claim 24, wherein top portions of the forking leads contact a top portion of the pin towards the IC device to minimize an electrical path length between the IC device and the circuit board.

* * * * *